United States Patent [19]

Anzalone

[11] 4,035,738
[45] July 12, 1977

[54] LOW NOISE AMPLIFIER

[75] Inventor: Philip J. Anzalone, Mount Ephraim, N.J.

[73] Assignee: The United States of America as represented by the Secretary of the Navy, Washington, D.C.

[21] Appl. No.: 687,287

[22] Filed: May 17, 1976

[51] Int. Cl.² .......................................... H03F 1/38
[52] U.S. Cl. .................................... 330/26; 330/28; 330/35; 330/103; 330/109; 330/188
[58] Field of Search ................. 330/26, 27, 28, 35, 330/103, 109, 188

[56] References Cited

U.S. PATENT DOCUMENTS 3,239,770  3/1966  Taber ............................... 330/28 X
3,487,163  12/1969  Brugler ........................... 330/28 X Primary Examiner—Rudolph V. Rolinec
Assistant Examiner—Lawrence J. Dahl
Attorney, Agent, or Firm—Richard S. Sciascia; Don D. Doty; Harvey A. David

[57] ABSTRACT

A low-noise, stage-stabilized, direct-coupled, single-ended amplifier circuit is disclosed which has a unique feedback network combined therewith in such manner that degenerative alternating current and substantially constant direct current feedback signals are supplied thereto, so as to effect an exceptionally steady amplification factor therefor over a very broad frequency response band.

5 Claims, 2 Drawing Figures

LOW NOISE AMPLIFIER

STATEMENT OF GOVERNMENT INTEREST

The invention described herein may be manufactured and used by or for the Government of the United States of America for governmental purposes without the payment of any royalties thereon or therefor.

FIELD OF THE INVENTION

The present invention, in general, relates to amplifiers and, in particular, is a stabilized, single-ended, multi-stage, low-noise amplifier with large negative feedback, low output impedance, and small physical dimensions.

DESCRIPTION OF THE PRIOR ART

Heretofore, to a considerable extent, differential amplifiers have been used because the various internal voltage and current drifts have been inherently cancelled in the dual stages therein. Hence, such an amplifier is more easily stabilized with respect to its operating point. However, since to amplifiers are incorporated therein, each thereof produces noise in substantially equal amounts which are additive and appear in the differential amplifier's total output. Consequently, the amplifier's total noise figure or signal-to-noise ratio is degraded. This is true because noise voltages add as the square root of the sum of the squares of the noise contribution of each amplifier of a differential amplifier.

Of course, single ended input stage amplifiers are well known, too; however, it is also well known that they are difficult to stablize, especially where feedback is employed, since the use of coupling and bypass capacitors therein is severely limited. Such limitation is due to the fact that such capacitors usually cause amplifiers to act as oscillators, rather than amplifiers. As a matter of fact, adverse results may occur when only two capacitors are used in the feedback network, due to the possibility of feedback phase shift being caused by the additional bypass capacitors of any powersupply associated therewith.

SUMMARY OF THE INVENTION

The instant invention overcomes many of the disadvantages of the aforementioned prior art, in that it is an amplifier that produces less noise at the output thereof, and it is more stable about or within its design operational frequency, quiescent point, or frequency response range. Moreover, the quiescent points of all of its stages are stabilized by direct coupling techniques and the incorporation of a unique negative feedback network in combination therewith which effectively provides nearly 100 percent direct current (D.C.) feedback thereto, as well as degenerative alternating current (A.C.) feedback.

An object, therefore, of this invention is to provide an improved amplifier.

Another object of this invention is to provide a relatively simple, single-ended, low noise amplifier.

Still another object of this invention is to provide a single-ended input stage, negative feedback amplifier that is more stable than heretofore obtainable and which will operate at very low frequencies, if desired.

A further object of this invention is to provide an amplifier that is less noisy than a comparable differential amplifier.

A further object of this invention is to provide an amplifier having an output impedance of about one-quarter ohm and an output swing capability of about 3.5 volts root means square into a 50 ohm load.

Another object of this invention is to provide an amplifier having an improved feedback network, an improved signal-to-noise ratio, and improved fidelity over a frequency response range of 4,000 to 500,000 cycles per second.

Other objects and many of the attendant advantages will be readily appreciated as the subject invention becomes better understood by reference to the following detailed description, when considered in conjunction with the accompanying drawings.

DESCRIPTION OF THE PREFERRED EMBODIMENTS

Figure 1:
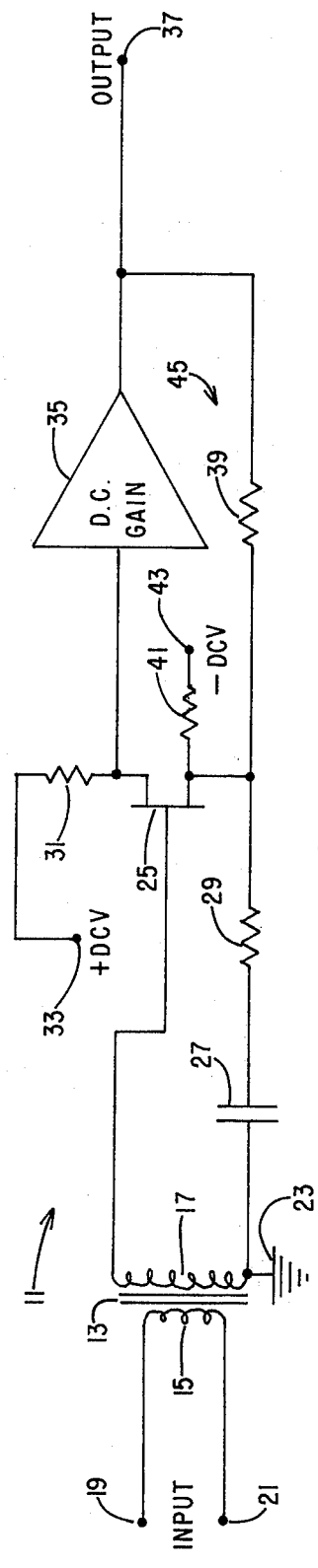
FIG. 1 depicts a simplified circuit diagram of the invention which facilitates the subsequent discussion of the theory of operation thereof.

Referring now to FIG. 1, there is disclosed a simplified circuit diagram 11, one of the embodiments of the instant invention, and disclosed therein is a one to 10 step-up voltage ratio input transformer 13 having a primary winding 15 and a secondary winding 17. As may readily be seen, said primary winding 15 is connected to a pair of terminals 19 and 21 which constitute the inputs of the subject circuit, Winding 17 of transformer 13 likewise has one of its terminals connected to a ground 23, with the other terminal thereof connected to the gate of a field effect transistor (FET) 25 of the C413N variety. The grounded terminal of secondary winding 17 of transformer 13 is connected to one of the plates of a capacitor 27, the other plate of which is connected through a resistor 29 to the source of the aforesaid field effect transistor 25. For reasons for which will be explained more fully subsequently, the aforementioned capacitor 27 should be designed to be very large with respect to all of the frequencies of interest upon which the subject invention will be intended to operate. The drain of field effect transistor 25 is connected through a resistor 31 to a positive direct current voltage (DCV) 33. The output of field effect transistor 24 which, of course, is the drain thereof, is connected to the input of a direct current gain amplifier 35, with the output thereof connected to an output terminal 37 which constitutes the output of the circuit of FIG. 1. The output of said direct current gain amplifier 35 is also connected through a resistor 39 to the aforesaid source of said field effect transistor 25 and through a resistor 41 to a negative direct current voltage 43. For reasons for which will be discussed more fully below, the aforementioned resistor 39, resistor 29, and capacitor 27 all effectively combined with step-up transformer 13 and field effect transistor 25 in such manner as to constitute a combination of direct current (DC) and negative alternating circuit (AC) feedback loop or network 45.

Figure 2:
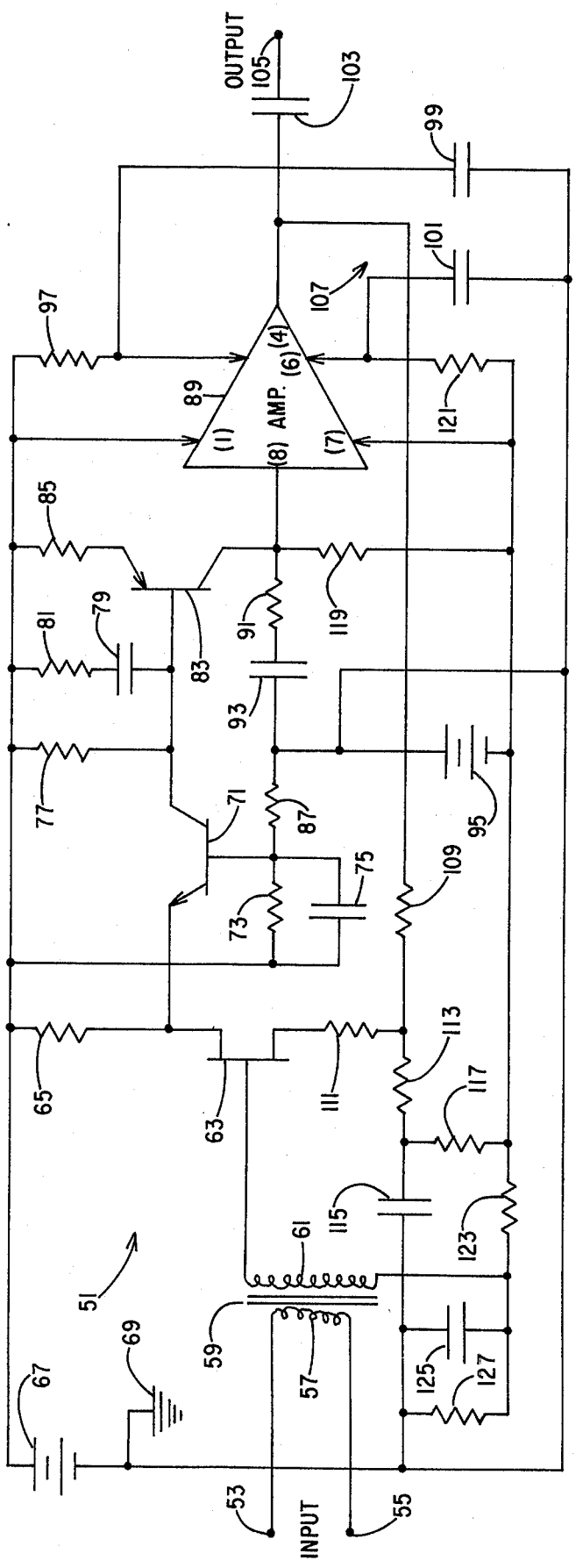
FIG. 2 is a schematic diagram of a preferred embodiment of the subject invention.

Referring now to FIG. 2, wherein the preferred embodiment of the subject invention is illustrated in schematic form as an electronic circuit 51, there shown a pair of input terminals 53 and 55 which constitute the input thereto and which are respectively connected to the end terminals of primary winding 57 of a one to 10 step-up voltage transformer 59. Said step-up transformer 59, of course, contains a secondary winding 61, with one of the output terminals thereof connected to the gate of a C413N field effect transistor (FET) 63.

The drain of said field effect transistor 63 is connected through a resistor 65 to the positive terminal of a 15 volt battery 67, the negative terminal of which is preferably connected to a ground 69. The drain of field effect transistor 63 is likewise connected to the emitter of a 2N-2222A NPN transistor 71, with the base thereof connected through a resistance 73 to the positive plate of the aformentioned battery 67. A capacitance 75 is connected in parallel with said resistance 73.

The collector of transistor 71 is connected through a resistor 77 to the positive plate of the aforesaid battery 67 and is also connected through a series connected capacitance 79 and resistance 81 to the positive plate of said battery 67, as well as to the base of a 2N-3637 PNP transistor 83. The emitter of transistor 83 connected through a resistor 85 to the positive plate of the aforementioned battery 67.

The base of transistor 71 is also connected through a resistor 87 to the negative terminal of the aforesaid battery 67 and preferably to the aforementioned ground 69.

The collector of the aforementioned transistor 83 is connected to the input of an operational amplifier 89 and through a series connected resistor 91 and capacitance 93 to the negative terminal of battery 67 and preferably to ground 69. Of course, as may readily be seen, the positive plate of another 15 volt battery 95 is connected to the negative terminal of the aforementioned 15 volt battery 67 and preferably to the aforesaid ground 69.

Operational amplifier 89 may be any operational amplifier that is suitable for inclusion within the subject invention; hence, the aforementioned LH0002H manufactured by the National Semi-Conductor Corporation may be used therefor or, in the alternative, the Z003 operational amplifier circuit shown on page 180 of Linear Integrated Circuit D.A.T.A. Book, 14th edition, dated 1975, and published by D.A.T.A., Incorporated of Orange, N.J., may likewise be used therefor, if so desired. Also, as may readily be seen, operational amplifier 89 has a plurality of terminals which correspond to those indicated in the aforesaid D.A.T.A. Book, although all thereof are not connected in this particular case.

Again, with respect to operational amplifier 89, terminal 8 thereof constitutes the data input thereto and, thus, as previously indicated, is connected to the collector of the aforementioned transistor 83. Terminal 1 thereof is connected directly to the positive plate of battery 67, and terminal 2 thereof is connected through a resistance 97 to the positive plate of battery 67 and through a capacitor 99 to the negative terminal of battery 67 and preferably to ground 69. Terminal number 6 of operational amplifier 89 is connected through a capacitor 101 to the negative terminal of battery 67. The output of operational amplifier 89 is taken from terminal 4 thereof and is connected through another capacitance 103 to an output terminal 105 which, in fact, constitutes the output of the subject invention.

The output of operational amplifier 89 is also connected to a negative feedback network herewith referenced as feedback network 107 which will now be discussed in greater detail, inasmuch as it is of paramount importance in the subject invention. Therefore, output terminal 4 of operational amplifier 89 is connected through a resistor 109 and a resistor 111 to the source of the aforementioned field effect transistor 63. The interconnection of said resistors 109 and 111 are connected through a series connected resistor 113 and capacitor 115 to the negative terminal of the aforementioned battery 67 and preferably to ground 69. The interconnection of resistor 113 and capacitor 115 is connected through a resistor 117 to the negative terminal of the aforementioned 15 volt battery 95, through another resistor 119 to input terminal 8 of operation amplifier 89, directly to terminal number 7 of said operational amplifier 89, and through a resistor 121 to terminal 6 of said operation amlifier 89. Another resistor 132 is connected between the other terminal of the secondary winding 61 of step-up transformer 59 and the negative terminal of the aforementioned battery 95. Likewise, a capacitance 125 and a resistance 127 connected in parallel therewith or connected between said other terminal of secondary winding 61 of step-up transformer 59 and the negative terminal of the aforementioned battery 67 and preferably ground 69, thereby completing the discussion of the aforesaid negative feedback network 107.

At this time, it would appear to be noteworthy that all of the elements and components incorporated in the devices shown in FIGS. 1 and 2 are well known, conventional, and commercially available. Therefore, it should be understood that it is their unique interconnecting and interactions which effect the subject invention and cause it to produce the objectives stated above, as well as the new and improved results which will be mentioned subsequently.

The preferred embodiment described above has intentionally been disclosed without limiting the respective values of the elements and components incorporated therein. Nevertheless, it has been found the the following listed values therefor have resulted in an amplifier that is highly satisfactory:

Transformer 59 = one to 10 step up.
Transistor 63 = C413N FET.
Transistor 71 = 2N2222A.
Transistor 83 = 2N3637.
Operational amplifier 89 = National Semiconductor LH0002H or
D.A.T.A., Inc. Z003, or the equivalent.
Battery 67 = 15 volts.
Battery 95 = 15 volts.
Resistor 65 = 1100 ohms.
Resistor 73 = 6190 ohms.
Resistor 77 = 1500 ohms.
Resistor 81 = 10 ohms.
Resistor 85 = 511 ohms.
Resistor 87 = 4640 ohms.
Resistor 91 = 82 ohms.
Resistor 97 = 100 ohms.
Resistor 109 = 10 ohms.
Resistor 111 = 121 ohms.
Resistor 113 = 196 ohms.
Resistor 117 = 1800 ohms.
Resistor 119 = 10 ohms.
Resistor 121 = 100 ohms.
Resistor 123 = 100,000 ohms.
Resistor 127 = 14,000 ohms.
Capacitor 75 = 1 microfarad.
Capacitor 79 = 330 microfarad.
Capacitor 93 = 100 microfarad.

Capacitor 99 = 1 microfarad.
Capacitor 101 = 1 microfarad.
Capacitor 103 = 11 microfarad.
Capacitor 115 = 11 microfarad.
Capacitor 125 = 1 microfarad.

Again, however, it should be understood that the aforesaid component values are representative only and, thus, others may be substituted therefor if the operational situation so warrants. Obviously, the making of such design choices would not violate the spirit or scope of the instant invention and would be well within the purview of the artisan having the benefit of the teachings presented herewith.

THEORY OF OPERATION

For the purpose of this discussion, resistance 41 and −DCV 43 will be considered as having been made sufficiently large that the quiescent current supplied to the source of field effect transistor 25 approximates a constant current source. Then, because the low side of resistor 29 is effectively at alternating current (AC) ground, the AC feedback voltage may be expressed as:

$$E_{ACFB} = E_{out} \left( \frac{R_{29}}{R_{29} + R_{39}} \right), \quad (1)$$

where $E_{ACFB}$ = said AC feedback voltage,
$E_{out}$ = voltage out of D.C. gain 35,
$R_{29}$ = the resistance of resistor 29 in ohms, and
$R_{39}$ = the resistance of resistor 39 in ohms.

Because the low side of $R_{29}$ is open for D.C., all of the direct current (D.C.) output voltage is fed back, and the quiescent points of both amplifier stages are stabilized. Thus, the closed loop A.C. gain may be varied simply by changing the resistance values of resistances 29 and 39, while the D.C. feedback remains 100 percent in order to provide good quiescent point stabilization. Consequently, it is possible to use a single-ended input stage and obtain a better internal "noise" figure and stability, while large amounts of inverse feedback are being used; and hence, a low noise, relatively stable, low output impedance, small size amplifier is readily attainable.

MODE OF OPERATION

For all practical purposes, the device of FIG. 2 works in a manner similar to that of FIG. 1; but, of course, as may readily be seen, it comprises more sophisticated circuitry which, during experimental test, produced only a 0.8 db noise figure, a vast improvement over that heretofore obtained from the prior art. Of course, it is recognized that the circuit of the subject invention is relatively simple and, thus, its mode of operation is relatively simple; furthermore, the new and improved results produced thereby ostensively make it unique in the amplifier art. Perhaps its simplicity alone makes it different and of significance. Hence, it appears to constitute some advancement in the art.

Due to the aformentioned structural simplicity of the invention, it will now be discussed briefly in conjunction with FIG. 2 of the drawing.

The signal to be amplified is, of course, an alternating or changing one, and it may be supplied to input terminals 53 and 55 by any device that is compatible with the invention. Hence, it may be seen that the uses and applications of the subject invention are numerous, indeed.

As the input signal is supplied to the invention, its voltage is stepped up by a factor of ten in transformer 59, after which the gain thereof is successively increased many times over in each of the internal amplifier stages containing transistor 63, transistor 71, transistor 83, operational amplifier 89, and their associated circuitry, respectively. Because said internal amplifier stages are direct coupled— instead of capacitance coupled—the quiescent points thereof are stabilized; therefore, amplification, rather than oscillation or phase shift, is the result, and an improved result it is, indeed. Moreover, as previously suggested, feedback network 107 provides approximately 100 percent feedback for direct current voltage, while the alternating current voltage gain thereof is determined by the following components and mathematical expression therefor:

$$G_{overall} = \left( \frac{R_{113} + R_{109}}{R_{113}} \right) N, \quad (2)$$

where, $G_{overall}$ = overall alternating current (AC) voltage gain of amplifier.
$R_{113}$ = resistance of resistor 113 in ohms,
$R_{109}$ = resistance of resistor 109 in ohms, and
$N$ = step-up ratio of transformer 59.

As a result of combining five amplifying means —that is, step-up transformer 59, transistors 63, 71, and 83, and operational amplifier 89—the output signal from said operational amplifier 89 is the amplified inversion of the input signal to terminals 53 and 55; hence, when said output signal is effectively supplied to the proper voltage levels to step-up transformer 59 and field effect transistor 63 by means of the circuit paths comprising one or more of resistors 109, 111, 113, 117, and 123, respectively, of network 107, the appropriate negative feedback voltage is effectively supplied thereto which, of course, then acts in the conventional negative feedback manners with respect thereto, thereby effectively controlling the total amplification factor of the subject amplifier in the desired manner.

At this time, it would appear to be noteworthy that because both DC and AC feedback are involved, the DC feedback enables the amplifier constituting the subject invention to operate in a stabilized manner at very low frequencies, while the AC feedback portion thereof functions in the normal degenerative manner. Furthermore, for most practical purposes, by-pass capacitor 115 should preferably be designed to have very large capacitance—say, for example, eleven microfads—for all operational frequencies.

With the aforementioned component values incorporated in the subject amplifier, and a source device having an output resistance of 50 ohms associated therewith, an internal noise figure of 0.8 db was measured at a frequency of 40 KHz, the frequency response thereof was of the order of 4,000 to 500,000 (3 db points), the output impedance was one fourth ohm, and the output swing capability was about 3.5 volts root mean square into a 50 ohm load. Obviously, other frequency ranges would be obtainable if different circuit values were used; but making the proper design choices thereof could be easily accomplished by the artisan having the benefit of the teachings presented herewith, if he desired to optimize the subject amplifier for any given operational circumstances.

Obviously, other modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included within the scope of the appended claims.

What is claimed is:

1. An amplifier, comprising in combination:
   a transformer having a primary winding and a secondary winding;
   a field effect transistor having a gate, a source, and a drain, with the gate thereof connected to one of the terminals of the secondary winding of said transformer;
   a first battery having a positive terminal and a negative terminal;
   a first resistance connected between the drain of said field effect transistor and the positive terminal of said first battery;
   a first transistor having a base, an emitter, and a collector, with the emitter connected to the drain of said field effect transistor;
   a second resistance connected between the base of said first transistor and the positive termial of the aforesaid first battery;
   a first capacitance connected in parallel with said second resistance;
   a third resistance connected between the collector of said first transistor and the positive terminal of said first battery;
   a second transistor having a base, an emitter, and a collector, with the base thereof connected to the collector of said first transistor;
   a series connected fourth resistance and second capacitance connected between the base of said second transistor and the positive terminal of said first battery;
   a fifth resistance connected between the base of said first transistor and the negative terminal of said first battery;
   a sixth resistance connected between the emitter of said second transistor and the positive terminal of said first battery;
   a series connected seventh resistance and third capacitance connected between the collector of said second transistor and the negative terminal of said first battery;
   operational amplifier means having a plurality of inputs and an output, with the data input thereof connected to the collector of said second transistor, with another of the inputs thereof directly connected to the positive terminal of said first battery;
   an eighth resistance connected between another of the inputs of said operational amplifier means and the positive terminal of said first battery;
   a fourth capacitance connected between the interconnection of said eighth resistance and the another of the inputs of said operational amplifier and the aforesaid negative terminal of said first battery;
   a fifth capacitance connected between the negative terminal of said first battery;
   a fifth capacitance connected between the negative terminal of said first battery and still another of the inputs of said operational amplifier;
   a second battery having a positive terminal and a negative terminal, with the positive terminal thereof connected to the negative terminal of said first battery, and with the negative terminal thereof connected to still another input of the aforesaid operational amplifier;
   a ninth resistance connected between the collector of said second transistor and the negative terminal of said second battery;
   a 10th resistance connected between the negative terminal of the aforesaid second batter and said still another of the inputs of said operational amplifier;
   an 11th resistance, with one terminal thereof connected to the output of said operational amplifier;
   a 12th resistance connected between the other terminal of said 11th resistance and the source of said field effect transistor;
   a 13th transistor, with one terminal thereof connected to the interconnection of said 11th and 12th resistance;
   a 14th resistance, with one terminal thereof connected to the other terminal of said 13th resistance, and with the other terminal thereof connected to the negative terminal of said second battery;
   a 15th resistance, with one terminal thereof connected to the negative terminal of said second battery, and with the other terminal thereof connected to the other terminal of the secondary winding of the aforesaid transformer;
   a 6th capacitance connected between the other terminal of the secondary winding of said transformer and the negative terminal of said first battery;
   a 16th resistance connected in parallel with said sixth capacitance; and
   a 7th capacitance connected between the interconnection of said 13th and 14th resistances and the negative terminal of the aforesaid first battery.

2. The invention of claim 1, further characterized by a ground connected to the negative terminal of said first battery and the positive terminal of said second battery.

3. The invention of claim 1, further characterized by another capacitance connected to the output of the aforesaid operational amplifier.

4. A low noise, low frequency amplifier comprising in combination:
   a voltage step-up input transformer having a primary winding and a secondary winding;
   a field effect transistor having source, drain, and gate connections, said gate connection being connected only to a first end of said secondary, winding, said source connection being connected through resistance means to a negative voltage potential, and said drain connection being connected through resistance means to a positive voltage potential;
   a substantially linear direct current amplifier having an input connection and an output connection, said input connection being coupled to said drain connection of said field effect transistor so as to be responsive to changes in current flow therethrough to provide corresponding changes in voltage at said output connection; and
   a feedback network coupled to said output connection and operative to provide both direct current and alternating current negative feedback to said source connection of said field effect transistor;
said feedback network comprising a first feedback resistor connected to said output connection, a second feedback resistor connected in series with said first feedback resistor, the junction between said first and second feedback resistors being coupled to said source connection, and a capacitor connected in series between said second feedback resistor and ground, whereby said second feedback resistor is effectively open circuited for direct current and substantially all of the direct current component of the output signal at said output connection is applied via said first feedback resistor to said source connection as direct current negative feedback, while for the alternating current component of said output signal said first and second feedback resistors comprise a voltage divider so a predetermined fraction of said alternating current component is applied to said source connection of said field effect transistor.

5. An amplifier as defined in claim 4, and further characterized by transistor amplifier means for coupling said drain connection of said field effect transistor to said input connection of said direct current amplifier.

* * * * *